(12) United States Patent
Kusuda (10) Patent No.: US 11,953,562 B2
(45) Date of Patent: Apr. 9, 2024

(54) MI SENSOR AND METHOD FOR MANUFACTURING MI SENSOR

(71) Applicant: NIDEC-READ CORPORATION, Kyoto (JP)

(72) Inventor: Tatsufumi Kusuda, Kyoto (JP)

(73) Assignee: NIDEC-READ CORPORATION, Muko (JP)

( * ) Notice: Subject to any disclaimer, the term of this patent is extended or adjusted under 35 U.S.C. 154(b) by 614 days.

(21) Appl. No.: 17/043,768

(22) PCT Filed: May 21, 2019

(86) PCT No.: PCT/JP2019/020076
§ 371 (c)(1),
(2) Date: Sep. 30, 2020

(87) PCT Pub. No.: WO2020/003815
PCT Pub. Date: Jan. 2, 2020

(65) Prior Publication Data
US 2021/0109169 A1 Apr. 15, 2021

(30) Foreign Application Priority Data
Jun. 27, 2018 (JP) .................. 2018-121668

(51) Int. Cl.
*G01R 33/06* (2006.01)
*H01F 27/28* (2006.01)
*H01F 41/04* (2006.01)

(52) U.S. Cl.
CPC .......... *G01R 33/063* (2013.01); *H01F 27/28* (2013.01); *H01F 41/04* (2013.01)

(58) Field of Classification Search
None
See application file for complete search history.

(56) References Cited

U.S. PATENT DOCUMENTS

| 7,298,140 B2 | 11/2007 | Honkura et al. |
| 2005/0242805 A1* | 11/2005 | Honkura ............ G01R 33/0206 324/249 |

FOREIGN PATENT DOCUMENTS

| CN | 104820196 A | 8/2015 |
| JP | H1174582 A | 3/1999 |
| JP | 2001004726 A | 1/2001 |
| JP | 2002286823 A | 10/2002 |
| JP | 200647267 A | 2/2006 |
| JP | 2006300906 A | 11/2006 |
| JP | 2009229101 A | 10/2009 |
| JP | 2016194531 A | 11/2016 |

* cited by examiner

Primary Examiner — Jas A Sanghera
(74) Attorney, Agent, or Firm — VIERING, JENTSCHURA & PARTNER MBB (57) ABSTRACT

An MI sensor includes: an amorphous wire; an insulator layer formed on an outer peripheral surface of the amorphous wire; and an X-axis coil, a Y-axis coil, and a Z-axis coil which are formed, in a spiral shape, on an outer peripheral surface of the insulator layer. The X-axis coil, the Y-axis coil, and the Z-axis coil are formed of a conductive layer, and the X-axis coil, the Y-axis coil, and the Z-axis coil are arranged in directions orthogonal to each other.

9 Claims, 5 Drawing Sheets

MI SENSOR AND METHOD FOR MANUFACTURING MI SENSOR

CROSS-REFERENCE TO RELATED APPLICATIONS

This is the U.S. national stage of application No. PCT/JP2019/020076, filed on May 21, 2019, and priority under 35 U.S.C. § 119(a) and 35 U.S.C. § 365(b) is claimed from Japanese Patent Application No. 2018-121668, filed on Jun. 27, 2018; the disclosures of which are incorporated herein by reference.

FIELD

Various embodiments relate to an MI sensor and a method for manufacturing an MI sensor, and more particularly to a technique for manufacturing an MI sensor with a simple configuration.

BACKGROUND

Conventionally, there is known a magneto-impedance (MI) sensor including a magnetic conductor made of an amorphous wire and an electromagnetic coil wound around the magnetic conductor with an insulator interposed therebetween. There is also known the MI sensor in which a metal material containing copper is vacuum-deposited on an outer peripheral surface of an insulator to form a metallic film, and, then, an electromagnetic coil is formed by selective etching.

An MI sensor is typically configured by arranging three (or two) MI elements in X, Y, and Z directions to be orthogonal to each other as in the above-described related art in order to sense static and dynamic characteristics of an object in three dimensions (or two dimensions). An amorphous magnetic conductor is used at a central axis of each of the MI elements, and a coil (pickup coil) is formed so as to wind around the magnetic conductor. Then, a pulse current is cause to flow through the magnetic conductor, and the reaction thereof is detected by the coil.

In the above configuration, the MI element itself is small and, thus, the work of mounting the plurality of MI elements in combination on a substrate is complicated. Further, it is necessary to individually take out wirings connected to both ends in order to cause the pulse current to flow to both the ends of the magnetic conductor provided at the center. That is, for example, it is necessary to take out a total of six wirings from the magnetic conductors in the three MI elements in the three-dimensional MI sensor.

Further, it is necessary to separately form an upper part and a lower part of a coil in the case of an MI element using a semiconductor process, and thus, it is difficult to freely increase the number of turns. In addition, it is difficult to make a cross section of the coil circular, and the distance between a magnetic conductor and the coil is not constant, resulting in electrical loss.

Furthermore, in the case of an MI element in which a coil is formed by winding a wire material, such as an enamel wire, around an air-core cylindrical material, it is possible to relatively freely set the number of turns of the coil. However, it is necessary to insert the magnetic conductor as a core wire after forming the coil, and as a result, a space between the core wire and the coil is generated, so that the electrical loss occurs. Such an electrical loss causes variations in the detection accuracy of the MI element, and also causes individual differences among the MI elements.

In addition, it is necessary to apply high-frequency pulses from separate circuits to the magnetic conductors in the respective X, Y, and Z directions, or to apply pulses by externally connecting the magnetic conductors to each other. However, it is difficult to make the high-frequency pulses in the respective directions exactly the same in the former case, and the output is likely to vary due to the resistance of the connection portion in the latter case, which causes the individual differences in the X, Y, and Z directions of the MI sensor.

SUMMARY

An exemplary MI sensor according to the present disclosure includes: a linear magnetic conductor; an insulator layer formed on an outer peripheral surface of the magnetic conductor; and a first coil, a second coil, and a third coil which are formed, in a spiral shape, on an outer peripheral surface of the insulator layer. The first coil, the second coil, and the third coil are formed of a conductive layer, and the first coil, the second coil, and the third coil are arranged in directions orthogonal to each other.

Further, an exemplary method for manufacturing an MI sensor according to the present disclosure includes: an insulation step of forming an insulator layer on an outer peripheral surface of a linear magnetic conductor; a conductive layer formation step of forming a conductive layer on an outer peripheral surface of the insulator layer; a resist step of forming a resist layer on an outer peripheral surface of the conductive layer; an exposure step of exposing the resist layer with a laser to form a first groove strip, a second groove strip, and a third groove strip each having a spiral shape on an outer peripheral surface of the resist layer, form a first gap that surrounds the resist layer between the first groove strip and the second groove strip on the outer peripheral surface of the resist layer, and form a second gap that surrounds the resist layer between the second groove strip and the third groove strip on the outer peripheral surface of the resist layer; an etching step of performing etching using the resist layer as a masking material and removing the conductive layer in the first groove strip, the second groove strip, the third groove strip, the first gap, and the second gap to form a first coil with the conductive layer remaining around the first groove strip, form a second coil with the conductive layer remaining around the second groove strip, and form a third coil with the conductive layer remaining around the third groove strip; and a bending step of bending the magnetic conductor and the insulator layer between the first coil and the second coil and between the second coil and the third coil to arrange the first coil, the second coil, and the third coil in directions orthogonal to each other.

The above and other elements, features, steps, characteristics and advantages of the present disclosure will become more apparent from the following detailed description of the preferred embodiments with reference to the attached drawings.

DETAILED DESCRIPTION

MI Sensor 1A (First Embodiment)

First, a configuration of a magneto-impedance sensor (hereinafter, simply referred to as "MI sensor") 1A according to a first embodiment of the present disclosure will be described with reference to FIGS. 1 to 3. The MI sensor 1A performs magnetic sensing by utilizing a so-called MI phenomenon in which an induced voltage is generated in a coil 6 (an X-axis coil 6X, a Y-axis coil 6Y, and a Z-axis coil 6Z) in accordance with a change in the current flowing through a linear magnetic conductor (an amorphous wire 2 in the present embodiment).

The above-described MI phenomenon occurs with respect to the magnetic conductor made of a magnetic material having an electron spin arrangement in a circumferential direction with respect to a direction of the supplied current. When the current energizing this magnetic conductor is rapidly changed, a magnetic field in the circumferential direction is rapidly changed, and a spin direction of an electron changes in response to a peripheral magnetic field due to the action of the above change in the magnetic field. Then, the MI phenomenon is a phenomenon in which changes of internal magnetization of the magnetic conductor, an impedance, and the like occur at that time.

Figure 1:
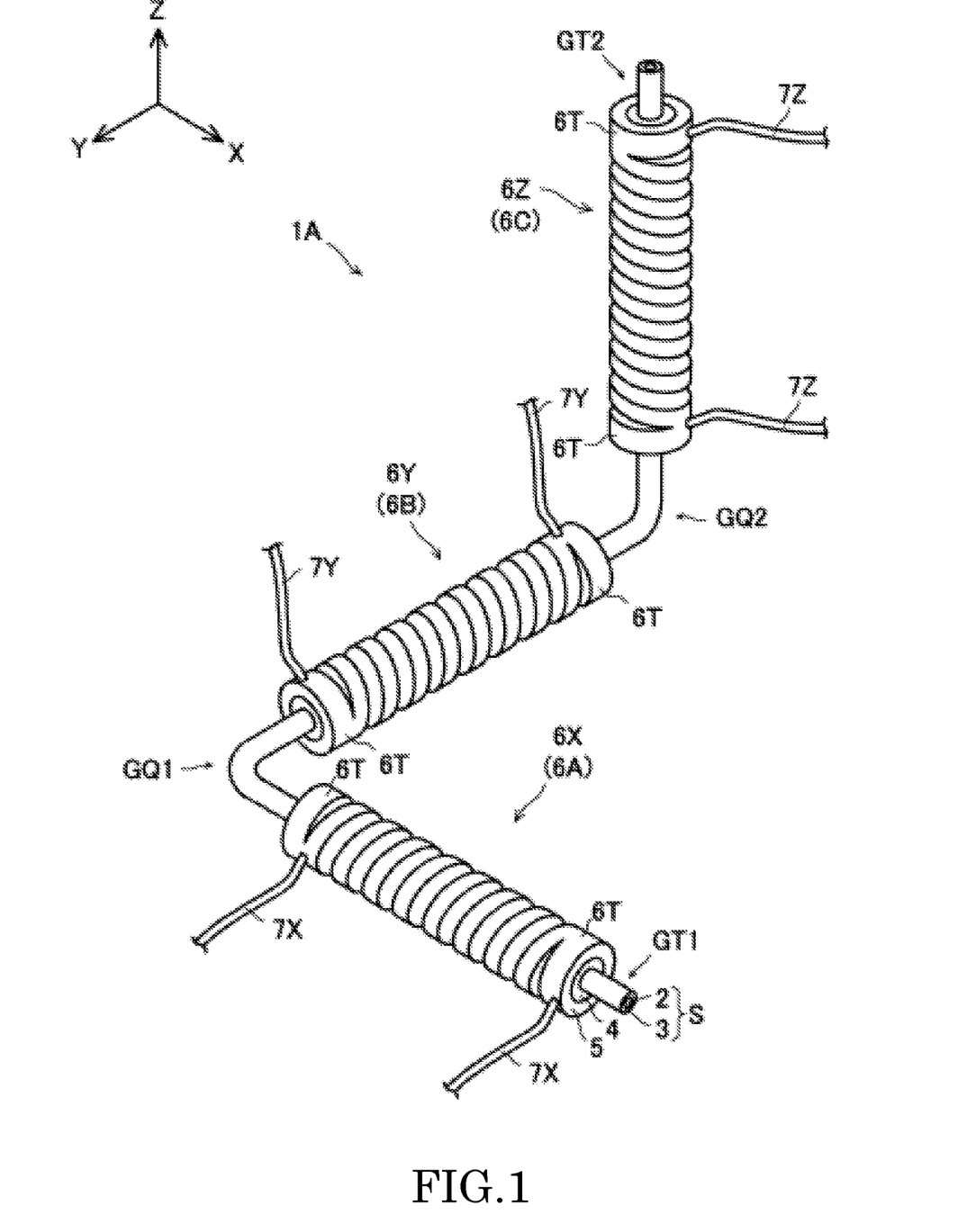
FIG. 1 is a perspective view illustrating an MI sensor according to a first embodiment.
Figure 3:
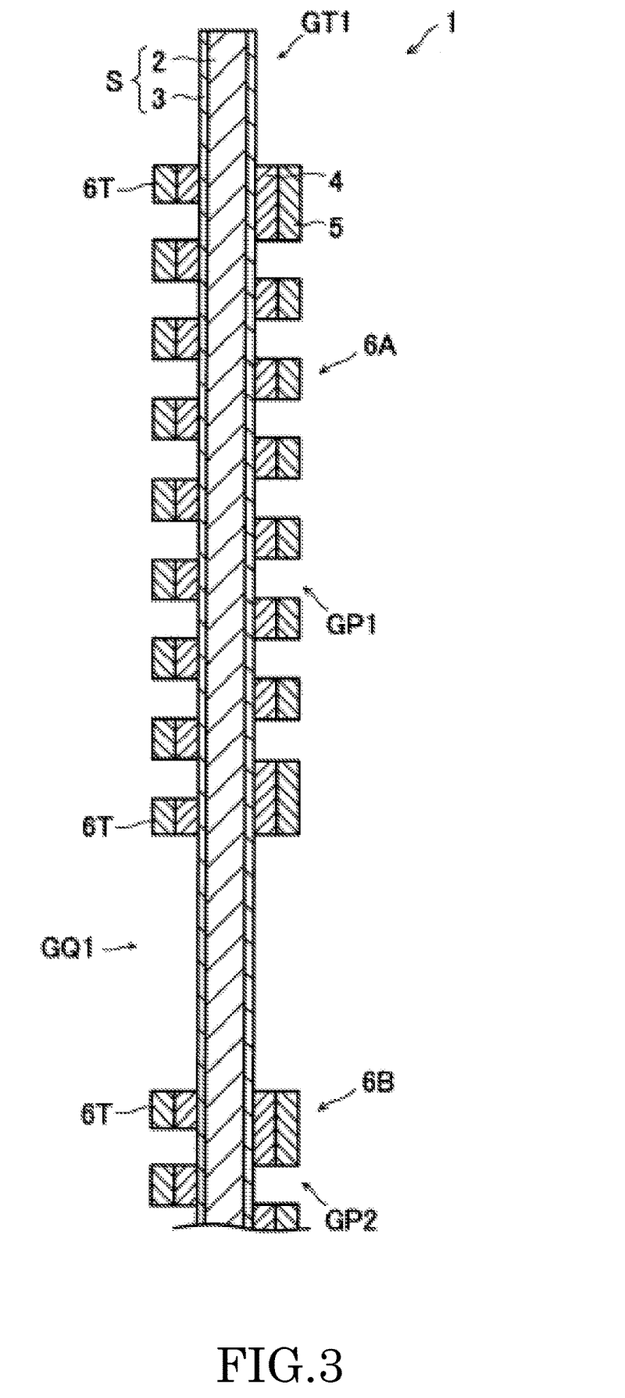
FIG. 3 is a cross-sectional view of a part taken along line III-III in FIG. 2.

As illustrated in FIGS. 1 and 3, an amorphous wire 2, which is a filament having a circular outer peripheral shape, such as CoFeSiB having a diameter of several tens of μm or less, is used as the linear magnetic conductor in the MI sensor 1A according to the present embodiment. In the present embodiment, the amorphous wire 2 having excellent magnetic sensitivity as the magnetic conductor is used to reduce the number of windings by increasing an output voltage per turn of the coil 6 and to shorten the length of the MI sensor 1A in the axial direction. An insulator layer 3, made of acrylic resin, is formed on an outer periphery of the amorphous wire 2 such that an outer peripheral shape of a cross section is circular. Note that, instead of the amorphous wire 2 adopted in the present embodiment, it is also possible to adopt a linear body coated with a magnetic anisotropic thin film or a Ni—Fe alloy, such as permalloy, as the magnetic conductor applied to the MI sensor 1A.

Specifically, the outer peripheral shape of the insulator layer 3 is formed in a circular shape concentric with the outer peripheral shape of the amorphous wire 2, that is, such that a thickness of the insulator layer 3 is uniform in the circumferential direction. More specifically, the amorphous wire 2 is immersed in an electrodeposition coating material in which an acrylic resin material is dispersed in a liquid in an ionic state, and a voltage is applied between the amorphous wire 2 and the electrodeposition coating material in a bath, so that the acrylic resin in the ionic state is electrodeposited on the amorphous wire. According to such a method, the thickness of the insulator layer can be controlled by the voltage to be applied. The electrodeposition coating material thus formed on the surface of the amorphous wire 2 is baked and solidified at a high temperature of, for example, 100 degrees or more to form the insulator layer 3. In the present embodiment, the amorphous wire 2 and the insulator layer 3 form a core wire S.

On an outer peripheral surface of the insulator layer 3, each of an X-axis coil 6X that is a first coil, a Y-axis coil 6Y that is a second coil, and a Z-axis coil 6Z that is a third coil is formed in a spiral shape. As illustrated in FIG. 1, each of the coils 6X to 6Z is formed of a conductive layer. Specifically, each conductive layer of the coils 6X to 6Z is formed by two layers of an electroless plating layer 4 and an electrolytic plating layer 5 formed on an outer peripheral surface of the electroless plating layer 4 (see FIG. 3). Note that the configuration of the conductive layer of the coils 6X to 6Z in the present embodiment is an example, and the conductive layer may have other configurations. For example, it is also possible to form the conductive layers of the coils 6X to 6Z using a technique such as sputtering.

The X-axis coil 6X, the Y-axis coil 6Y, and the Z-axis coil 6Z are arranged with their axes centered in the X-axis direction, the Y-axis direction, and the Z-axis direction as the core wire S is bent between the X-axis coil 6X and the Y-axis coil 6Y and between the Y-axis coil 6Y and the Z-axis coil 6Z as illustrated in FIG. 1. That is, the X-axis coil 6X, the Y-axis coil 6Y, and the Z-axis coil 6Z are arranged in directions orthogonal to each other. Note that it is also possible to partially cut off the core wire S between the X-axis coil 6X and the Y-axis coil 6Y and between the Y-axis coil 6Y and the Z-axis coil 6Z and arrange the X-axis coil 6X, the Y-axis coil 6Y, and the Z-axis coil 6Z in directions orthogonal to each other in the state of connecting the core wires S again.

As illustrated in FIG. 1, both ends of each of the X-axis coil 6X, the Y-axis coil 6Y, and the Z-axis coil 6Z are formed as annular coil electrodes 6T each of which surrounds the insulator layer 3. Wirings 7X to 7Z configured to measure induced voltages generated in the coils 6X to 6Z are connected to the respective coil electrodes 6T.

Figure 2:
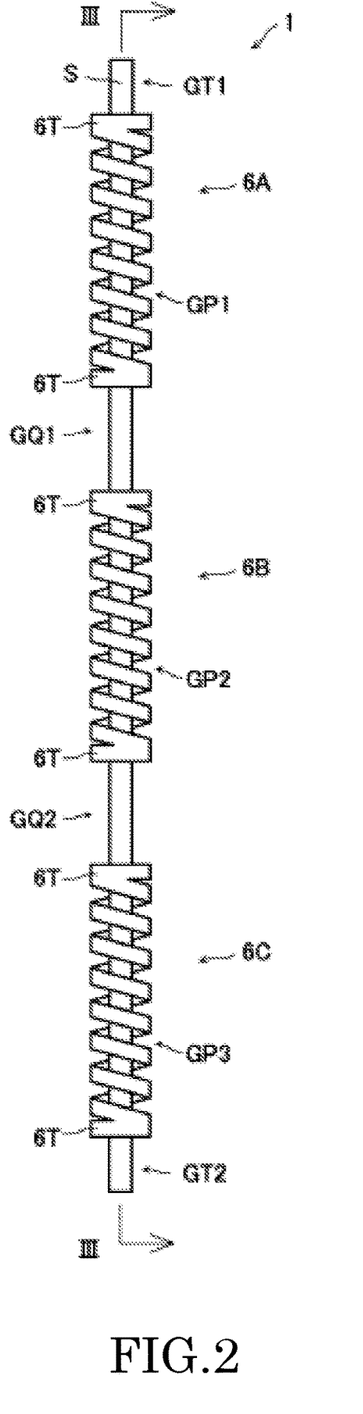
FIG. 2 is a front view illustrating the MI sensor while it is manufactured.

FIG. 2 is a front view illustrating an MI sensor (hereinafter, referred to as "linear sensor") 1 in a state before the core wire S is bent. In the linear sensor 1, a first coil 6A, a second coil 6B, and a third coil 6C are formed. The first coil 6A is formed with a first groove GP1 having a spiral shape. Similarly, the second coil 6B is formed with a second groove GP2, and the third coil 6C is formed with a third groove GP3.

A first gap portion GQ1 with only the core wire S is formed between the first coil 6A and the second coil 6B, and a second gap portion GQ2 with only the core wire S is formed between the second coil 6B and the third coil 6C. Further, a first terminal GT1 with only the core wire S is formed on an outer end side of the first coil 6A, and a second terminal GT2 with only the core wire S is formed on an outer end side of the third coil 6C. In the linear sensor 1 configured in this manner, the core wire S is bent to be orthogonal in the first gap portion GQ1 and the second gap portion GQ2. As a result, the MI sensors 1A in which the first coil 6A, the second coil 6B, and the third coil 6C are orthogonal to each other as the X-axis coil 6X, the Y-axis coil 6Y, and the Z-axis coil 6Z, respectively, is configured.

Figure 4:
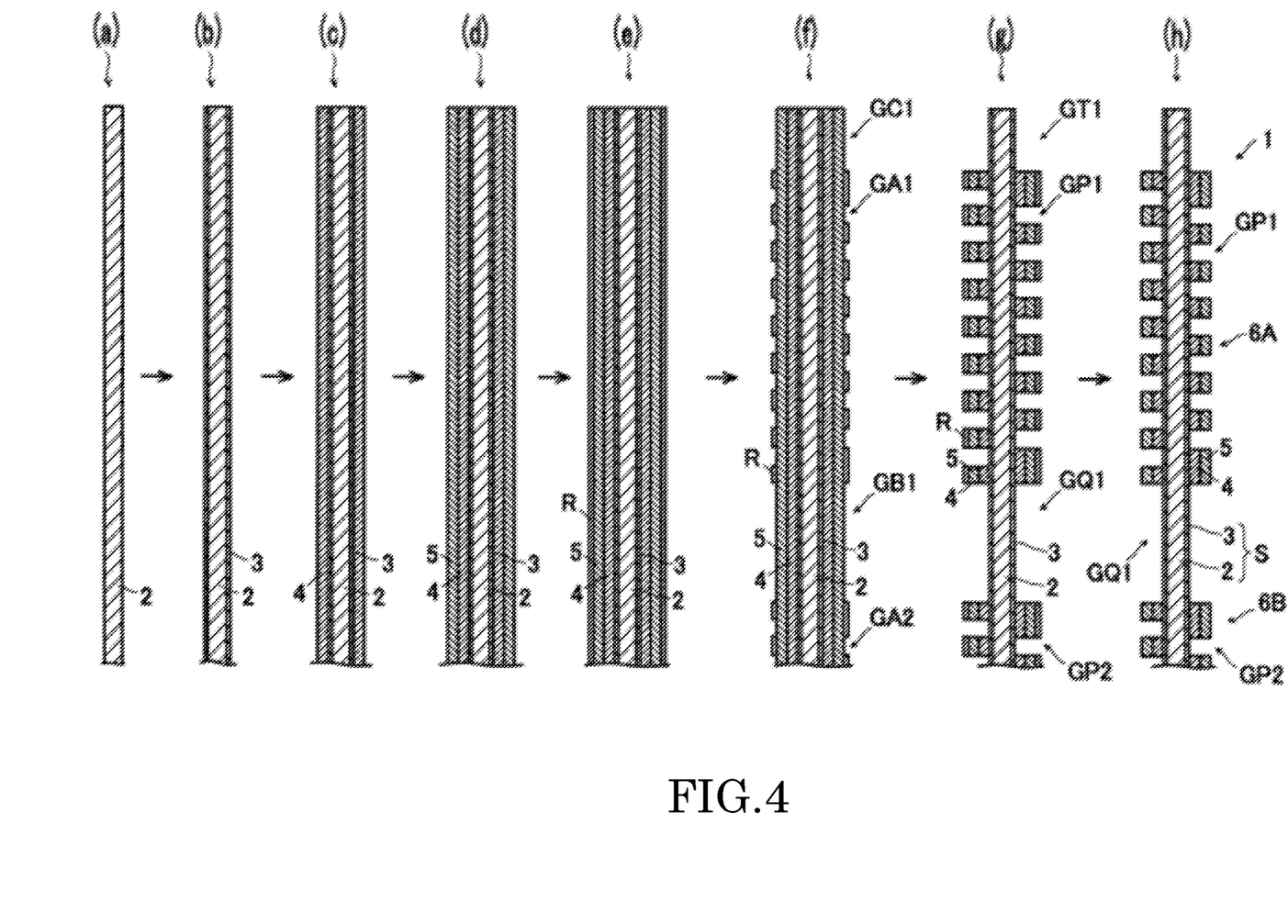
FIG. 4 is a view illustrating each manufacturing step of the MI sensor according to the first embodiment.

Next, a method for manufacturing the MI sensor 1A (steps up to manufacturing the linear sensor 1) will be described with reference to FIG. 4. In FIG. 4, (a) illustrates the amorphous wire 2 before an insulation step, (b) illustrates a state after the insulation step, (c) illustrates a state after an electroless plating step, (d) illustrates a state after an electrolytic plating step, (e) illustrates a state after a resist step, (f) illustrates a state after an exposure step, (g) illustrates a state after an etching step, and (h) illustrates a state after a resist removal step. Note that the linear sensor 1 has the same configuration repeatedly formed in the longitudinal direction, and thus, FIG. 4 illustrates only one end (around the first coil 6A) side and does not illustrate the other end side.

When manufacturing the MI sensor 1A according to the present embodiment, the amorphous wire 2 which is the filament having the circular outer peripheral shape is prepared as illustrated in (a) of FIG. 4. Then, an insulator is applied to an outer periphery of the amorphous wire 2 to form the insulator layer 3 as illustrated in (b) of FIG. 4 (the insulation step). At this time, the insulator layer 3 is formed such that the outer peripheral shape in the cross section is the circular shape concentric with the outer peripheral shape of the amorphous wire 2, that is, such that the thickness of the insulator layer 3 is uniform in the circumferential direction as illustrated in FIG. 3.

Next, the conductive layer constituted by the electroless plating layer 4 and the electrolytic plating layer 5 is formed on the outer peripheral surface of the insulator layer 3 (a conductive layer formation step). Specifically, electroless Cu plating is performed to form the electroless plating layer 4 on an outer peripheral surface of the insulator layer 3 as illustrated in (c) of FIG. 4 (the electroless plating step). Note that electroless Au plating can be also used in this step. Then, electrolytic Cu plating is performed to form the electrolytic plating layer 5 on an outer peripheral surface of the electroless plating layer 4 as illustrated in (d) of FIG. 4 (the electrolytic plating step). Note that electrolytic Au plating can be also used in this step. In this manner, a metallic film is formed on the insulator layer 3 using the electroless plating and the electrolytic plating in the present embodiment.

Next, the amorphous wire 2 on which the electrolytic plating layer 5 has been formed is immersed in a photoresist bath containing a photoresist solution, and then, is pulled up at a predetermined speed (for example, speed of 1 mm/sec), thereby forming a resist layer R on an outer peripheral surface of the electrolytic plating layer 5 as illustrated in (e) of FIG. 4 (the resist step).

Next, the resist layer R is exposed with a laser and the laser-exposed portion is dissolved with a developer to form a first groove strip GA1 and a second groove strip GA2 (and a third groove strip GA3 (not illustrated)) in a spiral shape on an outer peripheral surface of the resist layer R as illustrated in (f) of FIG. 4. Furthermore, a first gap GB1 that surrounds the resist layer R between the first groove strip GA1 and the second groove strip GA2 on the outer peripheral surface of the resist layer R (and a second gap GB2 (not illustrated) that surrounds the resist layer R between the second groove strip GA2 and the third groove strip GA3) is formed. Furthermore, a first end GC1 that surrounds the resist layer R on a side closer to an outer end than the first groove strip GA1 is on the outer peripheral surface of the resist layer R (and a second end GC2 (not illustrated) that surrounds the resist layer R on a side closer to an outer end than the third groove strip GA3) is formed. As a result, the electrolytic plating layer 5 is exposed in the first groove strip GA1, the second groove strip GA2, the third groove strip GA3, the first gap GB1, the second gap GB2, the first end GC1, and the second end GC2 (the exposure step).

The laser exposure in the above-described exposure step is performed while performing rotation around a central axis of the amorphous wire 2 on which the resist layer R is formed, and causing displacement in the axial direction. In the present embodiment, a positive photoresist is used in which the portion exposed with the laser is dissolved in the developer to form the various grooves (the first groove strip GA1, the second groove strip GA2, the third groove strip GA3, the first gap GB1, the second gap GB2, the first end GC1, and the second end GC2) in the resist layer R. Note that it is also possible to use a negative photoresist in which a portion not exposed to the laser is dissolved in the developer to form various grooves in the resist layer in this step.

In the present embodiment, the first end GC1, the first groove strip GA1, the first gap GB1, and the second groove strip GA2 are formed separately from each other as illustrated in (f) of FIG. 4. Similarly, the second groove strip GA2, the second gap GB2, the third groove strip GA3, and the second end GC2 are formed separately from each other.

Next, etching is performed using the resist layer remaining on the outer periphery of the electrolytic plating layer 5 as a masking material by immersing the amorphous wire 2 having the various grooves formed in the resist layer R in an acidic electrolytic polishing solution to perform electrolytically polishing. As a result, the electroless plating layer 4 and the electrolytic plating layer 5 in portions where the various grooves are used to be formed in the resist layer R are removed as illustrated in (g) of FIG. 4 (the etching step).

As illustrated in (g) of FIG. 4, the first groove GP1 having the spiral shape is formed in portions where the first groove strips GA1 are used to be formed in the electroless plating layer 4 and the electrolytic plating layer 5. Similarly, the second groove GP2 having the spiral shape is formed in portions where the second groove strips GA2 are used to be formed, and the third groove GP3 having the spiral shape is formed in portions where the third groove strips GA3 are used to be formed. That is, the first coil 6A is formed by the electroless plating layer 4 and the electrolytic plating layer 5 remaining around the first groove strip GA1 in this step. Similarly, each of the second coil 6B and the third coil 6C is formed by the electroless plating layer 4 and the electrolytic plating layer 5 remaining around each of the second groove strip GA2 and the third groove strip GA3.

Further, the first gap portion GQ1 and the second gap portion GQ2 are formed in portions where the first gap GB1 and the second gap GB2 are used to be formed. Further, the first terminal GT1 and the second terminal GT2 are formed in portions where the first end GC1 and the second end GC2 are used to be formed.

In the present embodiment, the first groove strip GA1 is formed separately from the first end GC1 and the first gap GB1 as described above. As a result, in the etching step, the electroless plating layer 4 and the electrolytic plating layer 5 remaining at both the ends of the first coil 6A are formed as the annular coil electrodes 6T surrounding the insulator layer 3. Similarly, the coil electrodes 6T are formed at both the ends of the second coil 6B by forming the second groove strip GA2 separately from the first gap GB1 and the second gap GB2. Similarly, the coil electrodes 6T are formed at both the ends of the third coil 6C by forming the third groove strip GA3 separately from the second gap GB2 and the second end GC2.

Next, the resist layers R remaining on the surfaces of the first to third coils 6A to 6C are removed using a stripping solution or the like as illustrated in (h) of FIG. 4 (the resist removal step).

Then, the linear sensor 1 is bent orthogonally at the first gap portion GQ1 and the second gap portion GQ2 to form the MI sensor 1A in which the X-axis coil 6X, the Y-axis coil 6Y, and the Z-axis coil 6Z are orthogonal to each other (a bending step).

As described above, the MI sensor 1A that integrally includes the X-axis coil 6X, the Y-axis coil 6Y, and the Z-axis coil 6Z can be manufactured in the method for manufacturing the MI sensor 1A according to the present embodiment. As a result, it is unnecessary to combine a plurality of MI elements at the time of mounting the MI sensor 1A, so that the mounting work can be simplified.

Further, it suffices to connect wirings to the first terminal GT1 and the second terminal GT2, respectively, to cause the pulse current to flow when the amorphous wire 2 is energized according to the MI sensor 1A of the present embodiment. That is, the two wirings for energizing the amorphous wire 2 can be formed, and thus, it is possible to easily perform the mounting as compared with a configuration in which three MI elements are respectively wired in the related art.

Further, in the method for manufacturing the MI sensor 1A according to the present embodiment, the outer peripheral shape of the cross section of the insulator layer 3 is formed into the circular shape in the insulation step so that the thickness of the insulator layer 3 is formed uniformly in the circumferential direction. As a result, the distance can be made constant without opening a space between the amorphous wire 2 and the coil 6 formed on the outer peripheral surface of the insulator layer 3. Specifically, it is possible to concentrically fill the space between the amorphous wire 2 and the coil 6 with the insulator layer 3, which is a substance whose magnetic permeability or dielectric constant is known. Therefore, the electrical loss in the coil 6 can be reduced, and the sensitivity of the MI sensor 1A can be improved.

More specifically, in the MI sensor 1A according to the present embodiment, however, the thickness of the insulator layer 3 is formed uniformly in the circumferential direction by forming the circular insulator layer 3 on the surface of the amorphous wire 2 having the circular cross section. Therefore, the distance between the amorphous wire 2 and the coil 6 can be made constant regardless of a position in the circumferential direction. As a result, it is possible to reduce variations in detection accuracy of the MI sensors 1A, and thus, it is possible to suppress individual differences among the MI sensors 1A. Further, it is also possible to make the multiple MI sensors 1A at the same time by the same process in the method for manufacturing the MI sensor 1A according to the present embodiment, and thus, it is possible to suppress the individual differences among the MI sensors 1A.

Furthermore, it is possible to unify the pulses given to the core wires of the coils 6 arranged in the respective X, Y, and Z directions without external connection, in the MI sensor 1A according to the present embodiment. That is, the same stimulation pulse can be applied to the sensor (coil 6) in each direction without strict control. As a result, it is possible to suppress the occurrence of individual differences in the X, Y, and Z directions in the MI sensor 1A. Note that the X-axis coil 6X, the Y-axis coil 6Y, and the Z-axis coil 6Z are orthogonal to each other so that no mutual inductance occurs.

As described above, with the method for manufacturing the MI sensor 1A according to the present embodiment, it is possible to manufacture the MI sensor 1A capable of simplifying the mounting work, reducing the electrical loss by providing the constant distance without opening the space between the amorphous wire 2 and the coil 6, and suppressing the individual differences and the occurrence of the individual differences in the X, Y, and Z directions.

Further, the annular coil electrode 6T that surrounds the insulator layer 3 is formed at both the ends of each of the X-axis coil 6X, the Y-axis coil 6Y, and the Z-axis coil 6Z in the MI sensor 1A according to the present embodiment. As a result, the wirings 7X to 7Z can be connected to the coil electrodes 6T regardless of postures of the coils 6X to 6Z, and thus, the mounting work can be performed more easily.

MI Sensor 1B (Second Embodiment)

Next, a configuration of an MI sensor 1B according to a second embodiment of the present disclosure will be described with reference to FIG. 5. In the present embodiment, a detailed description of the configurations common to those of the MI sensor 1A according to the first embodiment will be omitted, different configurations will be mainly described.

Figure 5:
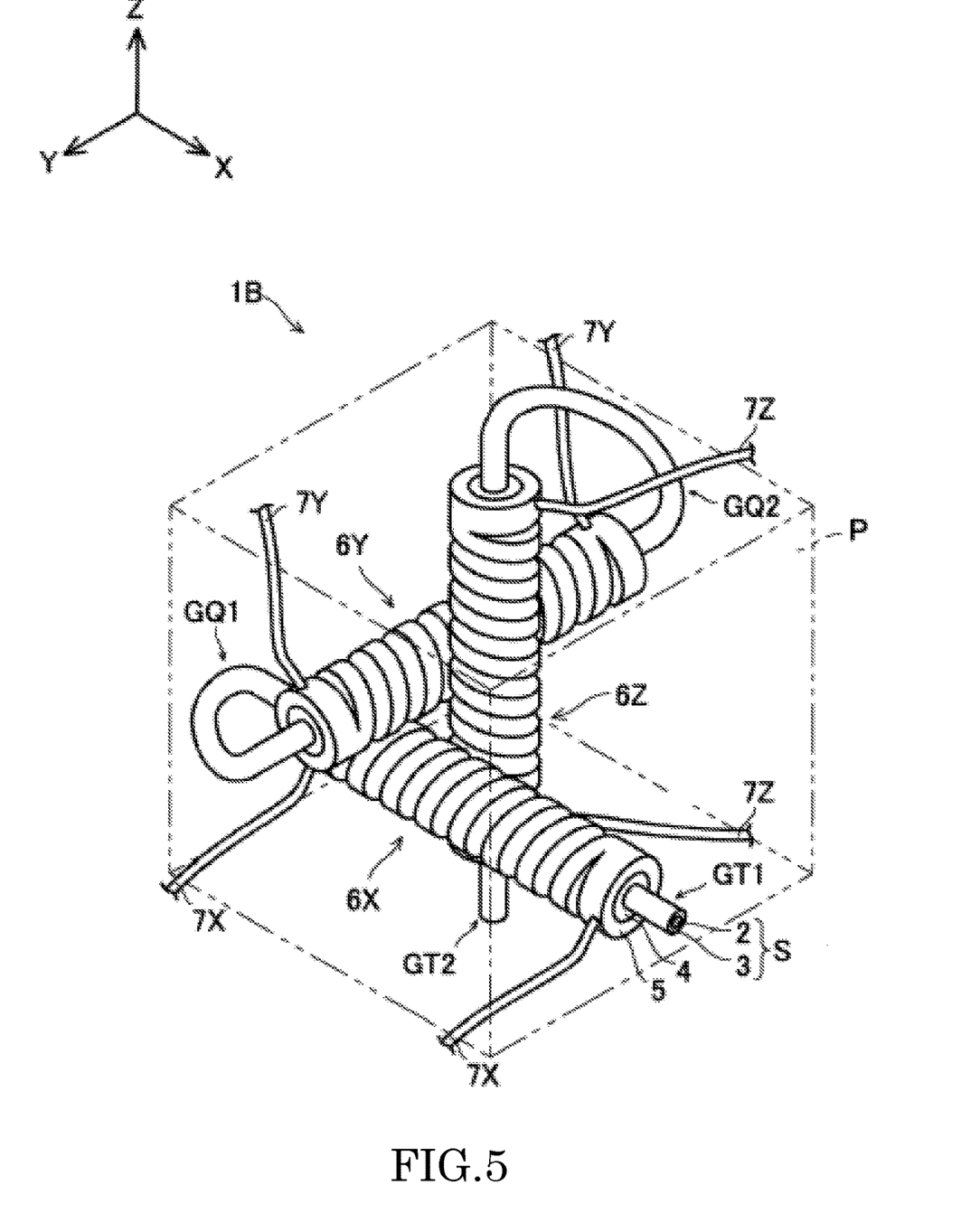
FIG. 5 is a perspective view illustrating an MI sensor according to a second embodiment.

As illustrated in FIG. 5, the MI sensor 1B according to the present embodiment is manufactured by fixing the X-axis coil 6X as a first coil, the Y-axis coil 6Y as a second coil, and the Z-axis coil 6Z as a third coil, which are arranged in a bending step, with a resin mold P as a fixing portion (through a fixing step). Specifically, the resin mold P is formed in a regular hexahedron, and each surface is formed in a shape orthogonal to the X axis, the Y axis, and the Z axis. In other words, each of the X-axis coil 6X, the Y-axis coil 6Y, and the Z-axis coil 6Z is accommodated in an internal region of the regular hexahedron formed by the resin mold P (region filled with the resin mold P), and is arranged to be fixed in a direction orthogonal to each surface forming the surface of the resin mold P.

According to the present embodiment, relative positions of the X-axis coil 6X, the Y-axis coil 6Y, and the Z-axis coil 6Z can be fixed, and thus, positions of the X-axis coil 6X, the Y-axis coil 6Y, and the Z-axis coil 6Z can be determined only by determining a position of the resin mold P. That is, the MI sensor 1B can further simplify the mounting work as compared with the MI sensor 1A according to the above embodiment.

Note that as a method of fixing the X-axis coil 6X, the Y-axis coil 6Y, and the Z-axis coil 6Z in the MI sensor 1B with the fixing portion, it is also possible to adopt other methods, such as a fixing method using a clip and a method of filling and fixing the circumference of each coil with a sealant, instead of the method using the resin mold P adopted in the present embodiment.

That is, an MI sensor according to an example of the present disclosure includes: a linear magnetic conductor; an insulator layer formed on an outer peripheral surface of the magnetic conductor; and a first coil, a second coil, and a third coil which are formed, in a spiral shape, on an outer peripheral surface of the insulator layer. The first coil, the second coil, and the third coil are formed of a conductive layer, and the first coil, the second coil, and the third coil are arranged in directions orthogonal to each other.

According to this configuration, it is possible to simplify the mounting work, to reduce an electrical loss by providing the constant distance without opening a space between the magnetic conductor and the coil, and to suppress the occurrence of individual differences among MI sensors and individual differences in the MI sensor in the X, Y, and Z directions.

Further, the first coil, the second coil, and the third coil are preferably fixed by a fixing portion in the MI sensor.

With this configuration, the mounting work can be further simplified.

Further, it is preferable that both ends of the first coil, the second coil, and the third coil be formed as annular coil electrodes each of which surrounds the insulator layer in the MI sensor.

With this configuration, the mounting work can be further simplified.

Further, a method for manufacturing an MI sensor according to an example of the present disclosure includes: an insulation step of forming an insulator layer on an outer peripheral surface of a linear magnetic conductor; a conductive layer formation step of forming a conductive layer on an outer peripheral surface of the insulator layer; a resist step of forming a resist layer on an outer peripheral surface of the conductive layer; an exposure step of exposing the resist layer with a laser to form a first groove strip, a second groove strip, and a third groove strip each having a spiral shape on an outer peripheral surface of the resist layer, form a first gap that surrounds the resist layer between the first groove strip and the second groove strip on the outer peripheral surface of the resist layer, and form a second gap that surrounds the resist layer between the second groove strip and the third groove strip on the outer peripheral surface of the resist layer; an etching step of performing etching using the resist layer as a masking material and removing the conductive layer in the first groove strip, the second groove strip, the third groove strip, the first gap, and the second gap to form a first coil with the conductive layer remaining around the first groove strip, form a second coil with the conductive layer remaining around the second groove strip, and form a third coil with the conductive layer remaining around the third groove strip; and a bending step of bending the magnetic conductor and the insulator layer between the first coil and the second coil and between the second coil and the third coil to arrange the first coil, the second coil, and the third coil in directions orthogonal to each other.

According to this configuration, it is possible to manufacture the MI sensors capable of simplifying the mounting work, reducing the electrical loss by providing the constant distance without opening the space between the magnetic conductor and the coil, and suppressing the occurrence of individual differences among the MI sensors and individual differences in the MI sensor in the X, Y, and Z directions.

Further, the method for manufacturing the MI sensor preferably includes a fixing step of fixing the first coil, the second coil, and the third coil, arranged in the bending step, with a fixing portion.

With this configuration, it is possible to manufacture the MI sensor that can simplify the mounting work.

Further, it is preferable to form a first end that surrounds the resist layer on a side closer to an outer end than the first groove strip is on the outer peripheral surface of the resist layer, to form a second end that surrounds the resist layer on a side closer to an outer end than the third groove strip on the outer peripheral surface of the resist layer, and to form the first end, the first groove strip, the first gap, the second groove strip, the second gap, the third groove strip, and the second end separately from each other in the exposure step, and to form the conductive layers remaining at both ends of the first coil, the second coil, and the third coil as annular coil electrodes in the etching step, each of the annular coil electrodes surrounding the insulator layer, in the method for manufacturing the MI sensor.

With this configuration, it is possible to manufacture the MI sensor that can further simplify the mounting work.

With the method for manufacturing the MI sensor and the MI sensor according to the examples of the present disclosure, it is possible to simplify the mounting work, to reduce the electrical loss by providing the constant distance without opening the space between the magnetic conductor and the coil, and to suppress the occurrence of individual differences among the MI sensors and individual differences in the MI sensor in the X, Y, and Z directions.

This application is based on Japanese Patent Application No. 2018-121668 filed on Jun. 27, 2018, the content of which is included in the present application. Note that the specific embodiments or examples described in the section of the description of embodiments are intended to clarify the technical contents of the present disclosure, and the present disclosure should not be narrowly interpreted as being limited only to such specific examples.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An MI sensor comprising:
   a linear magnetic conductor;
   an insulator layer formed on an outer peripheral surface of the magnetic conductor; and
   a first coil, a second coil, and a third coil which are formed, in a spiral shape, on an outer peripheral surface of the insulator layer,
   wherein the first coil, the second coil, and the third coil are formed of a conductive layer,
   the first coil, the second coil, and the third coil are arranged in directions orthogonal to each other, and
   wherein the linear magnetic conductor is bent between the first coil and the second coil and is bent between the second coil and third coil.

2. The MI sensor according to claim 1, wherein
   the first coil, the second coil, and the third coil are fixed by a fixing portion.

3. The MI sensor according to claim 2, wherein
   both ends of the first coil, the second coil, and the third coil are formed as annular coil electrodes, each of the annular coil electrodes surrounding the insulator layer.

4. The MI sensor according to claim 1, wherein
   both ends of the first coil, the second coil, and the third coil are formed as annular coil electrodes, each of the annular coil electrodes surrounding the insulator layer.

5. A method for manufacturing an MI sensor comprising:
   an insulation step of forming an insulator layer on an outer peripheral surface of a linear magnetic conductor;
   a conductive layer formation step of forming a conductive layer on an outer peripheral surface of the insulator layer;
   a resist step of forming a resist layer on an outer peripheral surface of the conductive layer;
   an exposure step of exposing the resist layer with a laser to form a first groove strip, a second groove strip, and a third groove strip each having a spiral shape on an outer peripheral surface of the resist layer, form a first gap that surrounds the resist layer between the first groove strip and the second groove strip on the outer peripheral surface of the resist layer, and form a second gap that surrounds the resist layer between the second groove strip and the third groove strip on the outer peripheral surface of the resist layer;
   an etching step of performing etching using the resist layer as a masking material and removing the conductive layer in the first groove strip, the second groove strip, the third groove strip, the first gap, and the second gap to form a first coil with the conductive layer remaining around the first groove strip, form a second coil with the conductive layer remaining around the second groove strip, and form a third coil with the conductive layer remaining around the third groove strip; and a bending step of bending the magnetic conductor and the insulator layer between the first coil and the second coil and between the second coil and the third coil to arrange the first coil, the second coil, and the third coil in directions orthogonal to each other.

6. The method for manufacturing an MI sensor according to claim 5, further comprising a fixing step of fixing the first coil, the second coil, and the third coil, arranged in the bending step, with a fixing portion.

7. The method for manufacturing the MI sensor according to claim 6, wherein in the exposure step, a first end that surrounds the resist layer is formed on a side closer to an outer end than the first groove strip is, on the outer peripheral surface of the resist layer; a second end that surrounds the resist layer is formed on a side closer to an outer end than the third groove strip is, on the outer peripheral surface of the resist layer; and the first end, the first groove strip, the first gap, the second groove strip, the second gap, the third groove strip, and the second end are formed separately from each other, and in the etching step, the conductive layers remaining at both ends of the first coil, the second coil, and the third coil are formed as annular coil electrodes each of which surrounds the insulator layer.

8. The method for manufacturing the MI sensor according to claim 5, wherein in the exposure step, a first end that surrounds the resist layer is formed on a side closer to an outer end than the first groove strip is, on the outer peripheral surface of the resist layer; a second end that surrounds the resist layer is formed on a side closer to an outer end than the third groove strip is, on the outer peripheral surface of the resist layer; and the first end, the first groove strip, the first gap, the second groove strip, the second gap, the third groove strip, and the second end are formed separately from each other, and in the etching step, the conductive layers remaining at both ends of the first coil, the second coil, and the third coil are formed as annular coil electrodes each of which surrounds the insulator layer.

9. An MI sensor comprising:

a linear magnetic conductor;

an insulator layer formed on an outer peripheral surface of the magnetic conductor; and a first coil, a second coil, and a third coil which are formed, in a spiral shape, on an outer peripheral surface of the insulator layer, wherein the first coil, the second coil, and the third coil are formed of a conductive layer, and the first coil, the second coil, and the third coil are arranged in directions orthogonal to each other, and wherein both ends of the first coil, the second coil, and the third coil are formed as annular coil electrodes, each of the annular coil electrodes surrounding the insulator layer.

* * * * *